(12) United States Patent
Brunsilius et al.

(10) Patent No.: US 7,830,199 B2
(45) Date of Patent: Nov. 9, 2010

(54) DYNAMICALLY-DRIVEN DEEP N-WELL CIRCUIT

(75) Inventors: Janet M. Brunsilius, Escondido, CA (US); Stephen R. Kosic, San Diego, CA (US); Corey D. Petersen, Poway, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/166,559

(22) Filed: Jul. 2, 2008

(65) Prior Publication Data

US 2010/0001787 A1  Jan. 7, 2010

(51) Int. Cl.
*H03K 3/01* (2006.01)
(52) U.S. Cl. ....................................... 327/534
(58) Field of Classification Search .......... 327/534–535
See application file for complete search history.

(56) References Cited

U.S. PATENT DOCUMENTS

| 6,038,116 | A | 3/2000 | Holberg et al. |
|---|---|---|---|
| 6,137,153 | A | 10/2000 | Le et al. |
| 6,194,952 | B1 * | 2/2001 | Shigehara ................... 327/534 |
| 6,356,137 | B1 | 3/2002 | Roohparvar et al. |
| 6,501,325 | B1 * | 12/2002 | Meng ........................ 327/536 |
| 2001/0038552 | A1 | 11/2001 | Ishimaru |

OTHER PUBLICATIONS

PCT International Search Report and Written Opinion for PCT/US2009/046863 mailed on Jul. 30, 2009.

* cited by examiner

*Primary Examiner*—Quan Tra
(74) *Attorney, Agent, or Firm*—Kenyon & Kenyon LLP

(57) ABSTRACT

A circuit includes an NMOS transistor having a drain and a source, a p-well containing the drain and the source, an n-well under the p-well, and a first well switch configured to selectively connect the n-well to a predetermined voltage in response to an enable phase of a first switching signal. The first well switch can be configured to connect the n-well to the predetermined voltage during the enable phase of the first switching signal and to electrically float the n-well during a non-enable phase of the first switching signal.

17 Claims, 9 Drawing Sheets

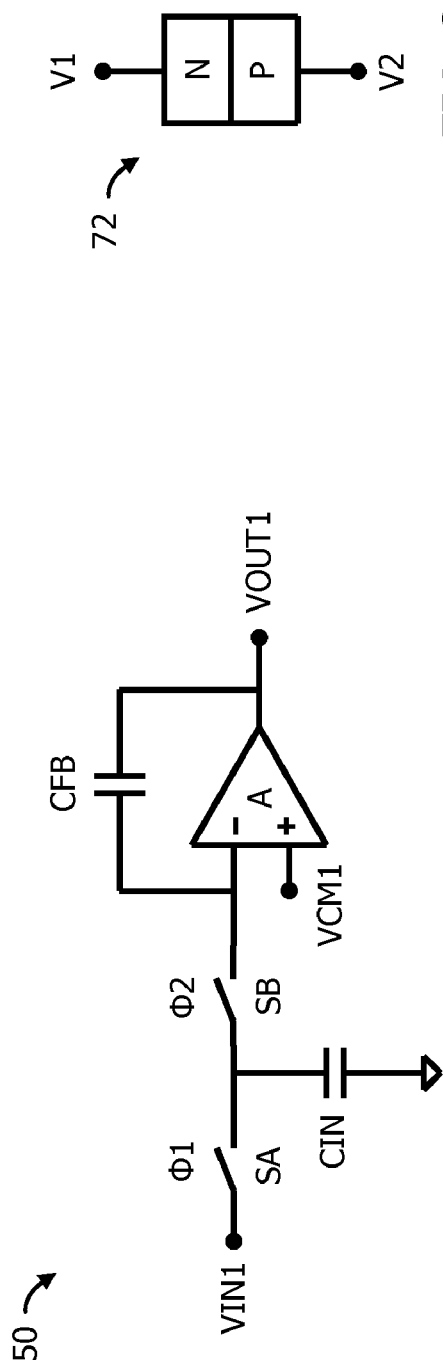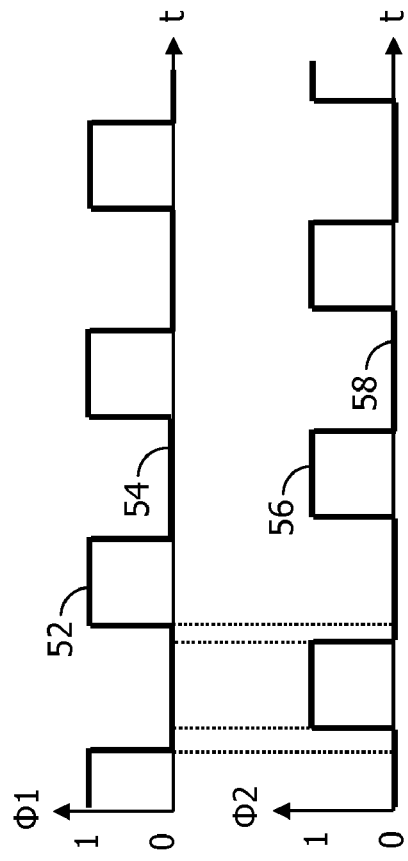
FIG. 3
FIG. 4
FIG. 5
FIG. 9

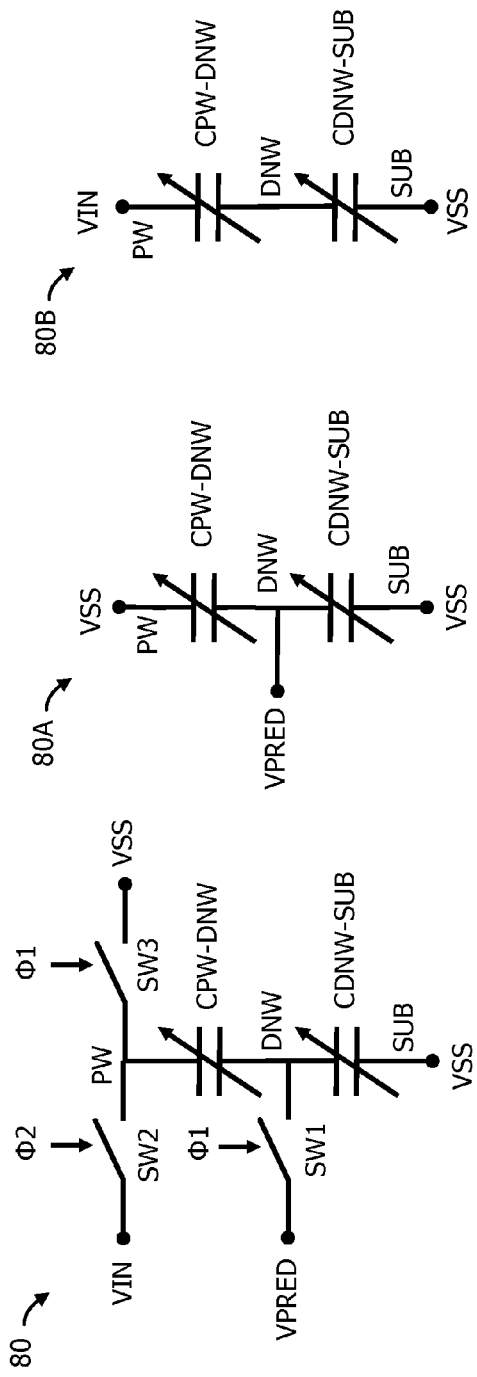
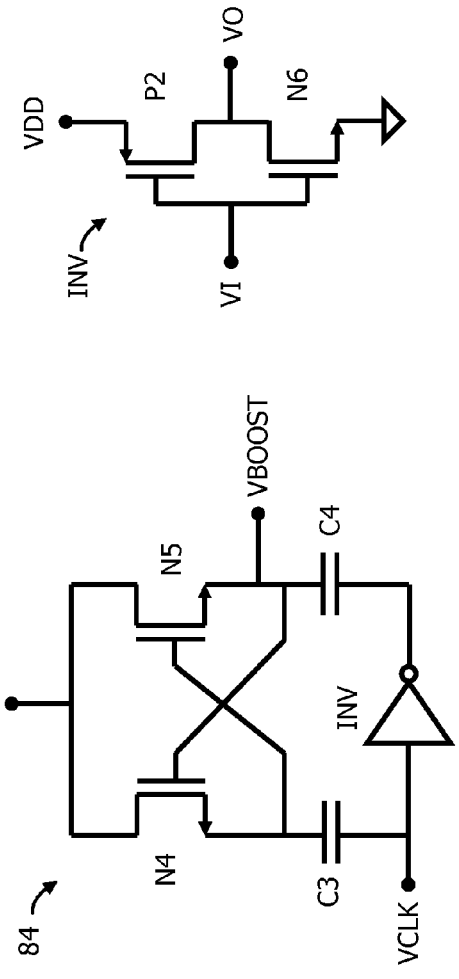
FIG. 12
FIG. 13
FIG. 14
FIG. 15
FIG. 16

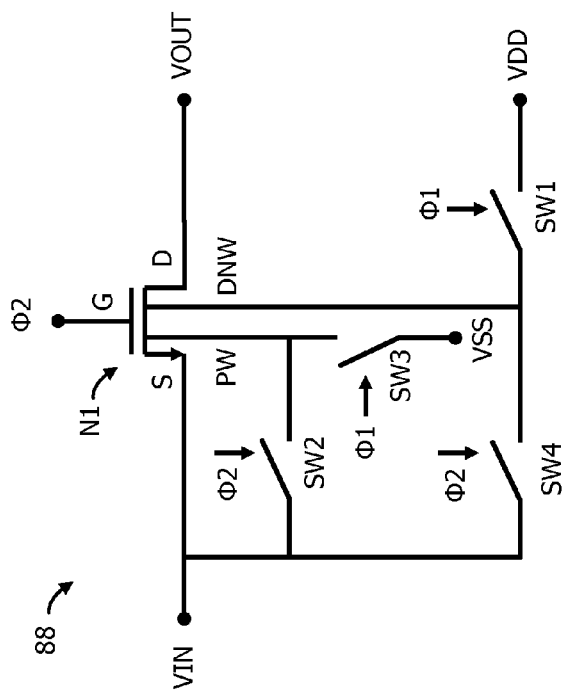
FIG. 17
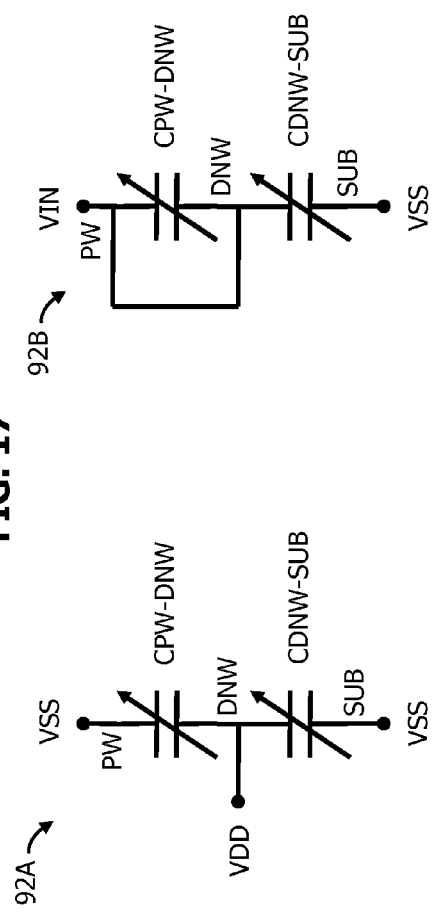
FIG. 19
FIG. 18

DYNAMICALLY-DRIVEN DEEP N-WELL CIRCUIT

BACKGROUND INFORMATION

Metal-oxide-semiconductor (MOS) transistors are common in many types of circuits. N-channel MOS (NMOS) transistors include n-type source and drain regions on either side of a p-type channel, and a gate above and separated from the channel by a dielectric. Applying a certain voltage to the gate can invert the channel to form an n-type conduction region between the drain and source. P-channel MOS (PMOS) transistors include p-type source and drain regions on either side of an n-type channel, and a gate above and separated from the channel by a dielectric. Applying a certain voltage to the gate can invert the channel to form a p-type conduction region between the drain and source. Note that the term metal-oxide-semiconductor transistor, and its use herein, does not limit MOS transistors to having a metal gate. Instead, MOS transistors (including NMOS and PMOS transistors), can include any type of transistor that is known in the art to be referred to by this term, including transistors having polysilicon gates.

Because NMOS and PMOS transistors have different types of drain, source and channel regions, they are typically formed utilizing separate, isolating well regions. For example, if both NMOS and PMOS transistors are to be formed on a p-type substrate (p-substrate), the drains and sources of the NMOS transistors can be formed as n-type regions (n-regions) in the p-substrate, with a portion of the p-type substrate used as the channel. In such circuit structure, an n-type well (n-well) can be formed on top of the p-substrate as a basis for PMOS transistors, the drains and sources of the PMOS transistors formed as p-type regions (p-regions) in the n-well and a portion of the n-well used as the channel. Such n-wells can accommodate either a single PMOS transistor or a plurality of PMOS transistors. One problem with this circuit structure, however, is that all NMOS transistors of a particular circuit may be contained in the same p-substrate. One potential disadvantage of such commonly located NMOS transistors is that they may be subject to a relatively high degree of electrical coupling through the common p-substrate. Such coupling may undesirably increase noise and other unintended deleterious effects.

At least partially for this reason, deep n-wells can be used to isolate NMOS transistors in a similar manner to isolation provided to PMOS transistors by p-wells. A deep n-well can be formed above the p-substrate, a p-well can then be formed above the deep n-well, and such a p-well can be used as a basis for NMOS transistors. That is, drains and sources of NMOS transistors can be formed as n-type regions in the p-well above the deep n-well, with a portion of the p-well used as the channel. As with the n-wells used to form PMOS transistors, the deep n-wells can accommodate either a single NMOS transistor or a plurality of NMOS transistors.

One problem with the use of deep n-wells as a basis for the formation of NMOS transistors, however, is that parasitic capacitances are formed at the border between the p-well and deep n-well, as well as at the border between the deep n-well and the p-well. These parasitic capacitances can be non-linear, varying in value during circuit operation depending on parameters such as the magnitude of a signal propagating through a circuit containing such a circuit structure. Such non-linear parasitic capacitances can have a deleterious effect on circuit performance.

BRIEF DESCRIPTION OF THE DRAWINGS

So that features of the present invention can be understood, a number of drawings are described below. It is to be noted, however, that the appended drawings illustrate only particular embodiments of the invention and are therefore not to be considered limiting of its scope, for the invention may encompass other equally effective embodiments.

FIG. 3 is a circuit schematic depicting an embodiment of another switched-capacitor circuit.

FIG. 4 depicts an embodiment of a first switching signal.

FIG. 5 depicts an embodiment of a second switching signal, the first and second switching signals having non-overlapping enable phases.

FIG. 9 depicts a cross-sectional view of an embodiment of a PN junction.

FIG. 12 is a circuit schematic depicting an embodiment of a configuration of parasitic capacitances of the circuit of FIG. 10.

FIG. 13 is a circuit schematic depicting an embodiment of a configuration of the parasitic capacitances of FIG. 12 during an enable phase of the first switching signal.

FIG. 14 is a circuit schematic depicting an embodiment of a configuration of the parasitic capacitances of FIG. 12 during an enable phase of the second switching signal.

FIG. 15 is a circuit schematic depicting an embodiment of a voltage-boosting circuit.

FIG. 16 is a circuit schematic depicting an embodiment of an inverter of the voltage-boosting circuit of FIG. 15.

FIG. 17 is a circuit schematic depicting an embodiment of another circuit having the NMOS transistor of FIG. 6 and a plurality of well switches.

FIG. 18 is a circuit schematic depicting an embodiment of a configuration of parasitic capacitances of the circuit of FIG. 17 during the enable phase of the first switching signal.

FIG. 19 is a circuit schematic depicting an embodiment of a configuration of parasitic capacitances of the circuit of FIG. 17 during the enable phase of the second switching signal.

DETAILED DESCRIPTION OF EXAMPLE EMBODIMENTS

Figure 1:
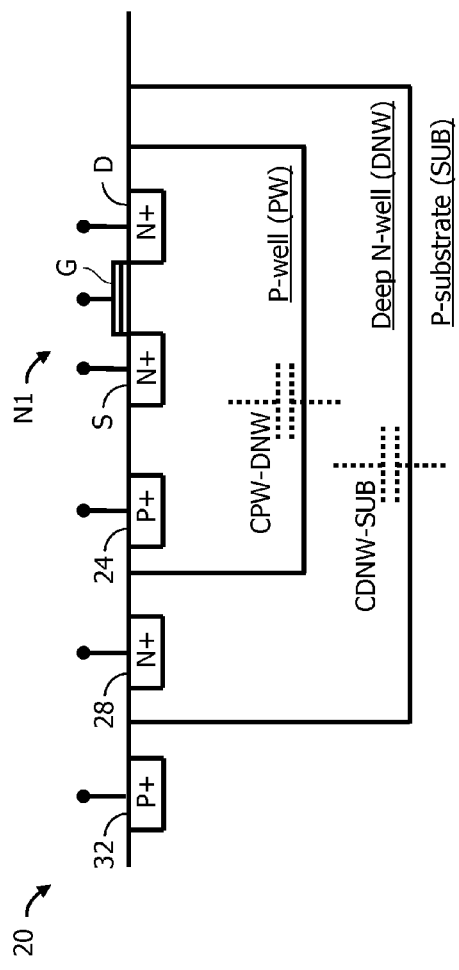
FIG. 1 depicts a cross-sectional view of an embodiment of a circuit structure having an NMOS transistor having a drain and source contained in a p-well formed above a deep n-well.

FIG. 1 depicts a cross-sectional View of an embodiment of a circuit structure 20 having an NMOS transistor N1 formed on a p-substrate SUB. The NMOS transistor N1 includes a drain D, a source S and a gate G. The drain D and source S are contained in a p-well PW, which itself is contained in a deep n-well DNW. The drain D and source S are on either side of a channel region formed by a portion of the p-well PW.

In addition to the drain D and source S of the NMOS transistor N1, the p-well PW contains a contact 24 that includes a p-type region formed in and having a relatively higher dopant concentration than the p-well PW. Similarly, the deep n-well DNW includes a contact 28 that includes a n-type region formed in and having a relatively higher dopant concentration than the deep n-well DNW. The p-substrate SUB includes a contact 32 that includes a p-type region formed in and having a relatively higher dopant concentration than the p-substrate SUB. Generally speaking, contacts allow an electrical connection to a semiconductor region in which they are situated. Contacts to semiconductor regions are formed from the same type of semiconductor as the contacted region, i.e., p-type or n-type, but typically at a relatively higher concentration than other portions of the contacted region. Thus, in FIG. 1, the p-well contact 24 is denoted as a p+ region, the deep n-well contact 28 is denoted as an n+ region, and the p-substrate contact 32 is denoted as a p+ region.

The deep n-well DNW is referred to as deep because it is below, and thus relatively deeper, than the p-well PW containing the drain D and source S of the NMOS transistor N1. However, the term deep is a relative, and is meant only to describe the positional relationship between the p-well PW and the deep n-well DNW, rater than be limiting in a sense of implying specific depths. Furthermore, the circuit structure 20 of FIG. 1 is not the only geometric relationship possible between the p-well PW and the deep n-well DNW.

FIG. 1 also depicts a pair of parasitic capacitors CPW-DNW, CDNW-SUB, shown in dashed lines, that are inherently formed as part of the depicted circuit structure 20. A first parasitic capacitance CPW-DNW is formed about the border between the p-well PW and the deep n-well DNW. The first parasitic capacitance CPW-DNW has a first portion formed by part of the p-well PW and a second portion formed by part of the deep n-well DNW. The first and second portions of the first parasitic capacitance CPW-DNW can operate akin to plates of a parallel-plate capacitor, however with non-homogenous and less distinctly-defined geometric borders. A second parasitic capacitance CDNW-SUB is formed about the border between the deep n-well DNW and the p-substrate SUB. The second parasitic capacitance CDNW-SUB has a first portion formed by part of the deep n-well DNW and a second portion formed by part of the p-substrate SUB.

The first and second parasitic capacitances CPW-DNW, CDNW-SUB can appear in circuits having the circuit structure 20 depicted in FIG. 1. For example, the first parasitic capacitance CPW-DNW can appear between a circuit node connected to the p-well PW, e.g., at a circuit node connected to the p-well contact 24, and a circuit node connected to the deep n-well DNW, e.g., at a circuit node connected to the deep n-well contact 28. The second parasitic capacitance CDNW-SUB can appear between the circuit node connected to the deep n-well DNW and a circuit node connected to the p-substrate SUB, e.g., a circuit node connected to the p-substrate contact 32.

The circuit structure 20 having the NMOS transistor N1 depicted in FIG. 1 can be used in many different types of circuits. An exemplary type of circuit that can utilize the circuit structure 20 and NMOS transistor N1 of FIG. 1 are switched-capacitor circuits. Switched-capacitor circuits typically include switches, along with amplifiers, in arrangements configured to implement specific input-to-output transfer functions. Switched-capacitor circuits can be used in gain stages, filters, digital-to-analog converters (DACs), analog-to-digital converters (ADCs), sample-and-hold amplifiers (SHAs) and in many other applications. The switches of switched-capacitor circuits are selectively switched on and off by clock signals to realize the transfer functions.

Figure 2:
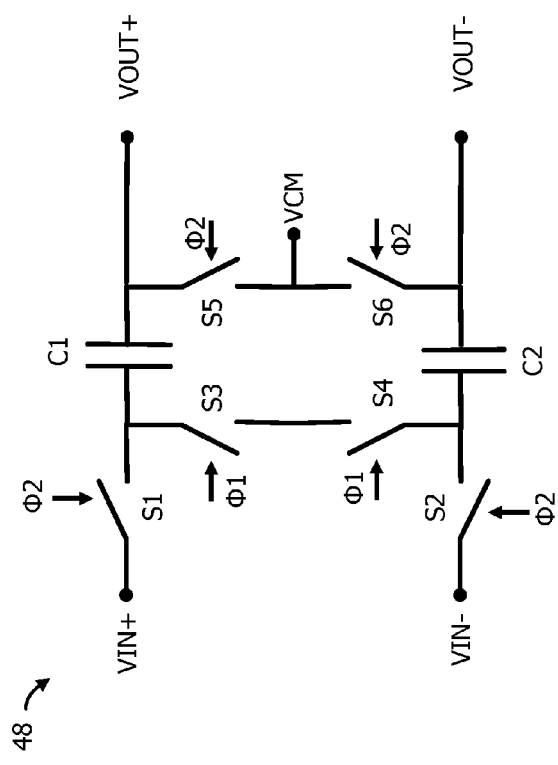
FIG. 2 is a circuit schematic depicting an embodiment of a switched-capacitor circuit.

FIG. 2 depicts one embodiment of a switched-capacitor circuit 48 that can include the NMOS transistor N1 formed in association with the deep n-well DNW as depicted in FIG. 1. The switched-capacitor circuit 48 includes a plurality of switches S1, S2, S3, S4, S5, S6, and a plurality of capacitors C1, C2, and is a differential circuit, having a positive signal channel and a negative signal channel. The switched-capacitor circuit 48 receives a positive input voltage VIN+ to the positive signal channel and a negative input voltage VIN− to the negative signal channel, and generates a positive output voltage VOUT+ from the positive signal channel and a negative output voltage VOUT− from the negative signal channel. The switched-capacitor circuit 48 also receives a common-mode voltage VCM. Generally speaking, the switched-capacitor circuit 48 can function to sample the positive and negative input voltages VIN+, VIN− onto the capacitors C1, C2, and produce output voltages VOUT+, VOUT− as a function of the sampled voltages, according to switching signals applied to the plurality of switches S1, S2, S3, S4, S5, S6. The switched-capacitor circuit 48 can be used in a variety of applications and be a part of a larger circuit. For example, the switched-capacitor circuit 48, as depicted, can be used as an input stage for an ADC. In FIG. 2, any of the switches S1, S2, S3, S4, S5, S6 can optionally be implemented using the circuit structure 20, having the NMOS transistor N1, depicted in FIG. 1.

Typically, in operation, switched-capacitor circuits, including the switched-capacitor circuit 48 of FIG. 2, have their switches switched according to a two-phase clocking scheme. FIGS. 4 and 5 depict an embodiment of switching signals of such a scheme, including a first switching signal φ1 and a second switching signal φ2. The first switching signal φ1 has a first logic-high (denoted as 1 in FIGS. 4 and 5) enable phase 52 and the second switching signal φ2 has a second logic-high enable phase 56. The first and second switching signals φ1, φ2 have non-overlapping enable phases 52, 56, i.e., the first enable phase 52 and the second enable phase 56 are temporally mutually exclusive. A switch receiving the switching signal at its switching terminal is switched on, i.e., enabled, during the enable phase and switched off, i.e., disabled, otherwise, i.e., during the non-enable phase, which is the remaining portion of the switching signal other than the enable phase.

Regarding the switched capacitor circuit 48 of FIG. 2, a first subset S3, S4 of the plurality of switches S1, S2, S3, S4, S5, S6 can receive the first switching signal φ1 at their switching terminals, and a second subset S1, S2, S5, S6 can receive the second switching signal φ1 at their switching terminals. Note that the first and second switching signals φ1, φ2 can be identical to each other except for being 180° out of phase. Thus, the assignment of first and second switching signals φ1, φ2 to particular ones of the switches in FIG. 2 can be reversed, so long as the grouping of switches to particular ones of the switching signals is maintained.

Although the exemplary switched-capacitor circuit 48 of FIG. 2 is a differential circuit, circuits including the NMOS transistor N1 formed in association with the deep n-well DNW, as depicted in FIG. 1, can also include single-ended circuits. FIG. 3 depicts an exemplary embodiment of a single-ended circuit 50, configured to operate as a discrete-time integrator, that can include the NMOS transistor N1 formed in association with the deep n-well DNW. The circuit 50 of FIG. 3 includes a pair of switches SA, SB configured to receive the first and second switching signals φ1, φ2 at their switching terminals, input and feedback capacitors CIN, CFB, and a differential-to-single ended amplifier A, and is configured to receive an input voltage VIN1 and produce an output voltage VOUT1. In FIG. 3, either of the switches SA, SB can optionally be implemented using the circuit structure 20, having the NMOS transistor N1, depicted in FIG. 1.

Figure 6:
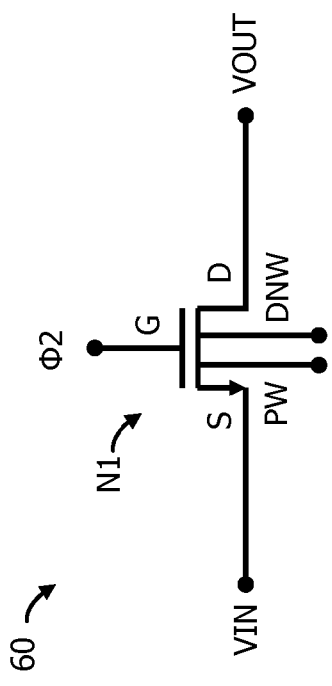
FIG. 6 is a circuit schematic depicting an embodiment of the NMOS transistor having the drain and source contained in the p-well formed above the deep n-well.

FIG. 6 depicts an embodiment of a circuit 60 that can be used to implement, e.g., the first or second switch S1, S2 of the switched-capacitor circuit 48 of FIG. 2 In FIG. 6, the switch is implemented by the NMOS transistor N1 having the circuit structure 20 of FIG. 1, in which the NMOS transistor N1 is formed in association with the deep n-well DNW. FIG. 6 includes a schematic representation of the NMOS transistor N1 depicted in a cross-sectional view in FIG. 1.

The schematic representation of the NMOS transistor N1 of FIG. 6 includes an NMOS transistor symbol representing the NMOS transistor having terminals representing the gate G, source S, drain D, p-well PW, and the deep n-well DNW. The circuit of FIG. 6 includes an input voltage VIN and an output voltage VOUT at the source S and drain D of the NMOS transistor N1, respectively. In FIG. 6, the gate G of the NMOS transistor N1 receives the first switching signal φ1. Generally speaking, the gate of a transistor is used as the switching terminal.

In switched-capacitor circuit embodiments, the NMOS transistor N1 depicted in FIG. 6 can also be referred to a signal-path NMOS transistor N1, because the NMOS transistor N1 is part of a path followed by channel signal making its way through the switched-capacitor circuit.

Note that, although the embodiment of FIG. 6 can represent an implementation of the first switch S1 of the switched-capacitor circuit 48 of FIG. 2, the circuit 60 of FIG. 6 can also represent an implementation of other switches in the switched-capacitor circuit 48 of FIG. 2, or a fundamental building block of many different types of circuits. That is, use of the NMOS transistor N1 formed in association with the deep n-well DNW, and configured and operated as described herein, is not limited to switched-capacitor circuits, but can also be used in a variety of other circuits, such as operational amplifiers, comparators, DACs, ADCs, filters, and many other types of circuits.

Figure 7:
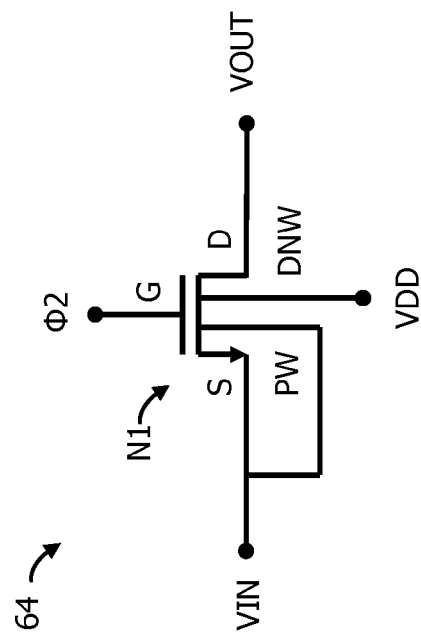
FIG. 7 is a circuit schematic depicting an embodiment of a circuit having the NMOS transistor of FIG. 6.

FIG. 7 depicts an embodiment of a circuit 64 having the NMOS transistor N1 of FIG. 6. In FIG. 7, the p-well PW is electrically connected to the source S of the NMOS transistor N1. This can be accomplished by electrically connecting the p-well contact 24 to the source S. Also, in FIG. 7, the deep n-well DNW is electrically connected to an upper supply voltage VDD. This can be accomplished by electrically connecting the upper supply voltage VDD to the deep n-well contact 28. The upper supply voltage VDD can be the highest supply voltage magnitude available in a particular circuit system. Alternatively, the upper supply voltage VDD can represent a voltage that is as high as, or higher than, any voltage presented, or expected to be presented, as the input voltage VIN or the first or second switching signals φ1, φ2.

Figure 8:
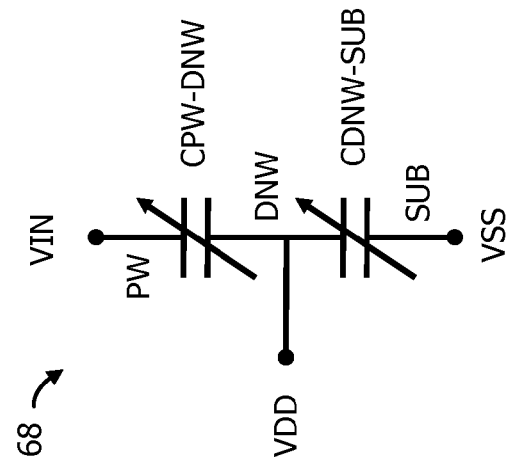
FIG. 8 is a circuit schematic depicting an embodiment of a configuration of parasitic capacitances of the circuit of FIG. 7.

FIG. 8 depicts an embodiment of a configuration 68 of the first and second parasitic capacitances CPW-DNW, CDNW-SUB, inherent in the NMOS transistor N1 of FIG. 1, resulting from the circuit 64 of FIG. 7. The first parasitic capacitance CPW-DNW, appearing between the p-well PW and the deep n-well DNW, receives the input voltage VIN at its first terminal (formed by part of the p-well PW) and receives the upper supply voltage VDD at its second terminal (formed by part of the deep n-well DNW). The second parasitic capacitance CDNW-SUB, appearing between the deep n-well DNW and the p-substrate SUB, receives the upper supply voltage VDD at its first terminal (formed by part of the deep n-well DNW) and receives a lower supply voltage VSS at its second terminal (formed by part of the p-substrate SUB). Note that neither FIG. 6 nor FIG. 7 explicitly shows the p-substrate SUB being connected to the lower supply voltage VSS because it is not necessarily customary to indicate a substrate terminal on an NMOS transistor symbol. However, in the circuits of FIGS. 6 and 7, and indeed in all of the circuit configurations described herein, the substrate is assumed to be connected to the lower supply voltage VSS. Note that the lower supply voltage VSS can be either ground (i.e., zero volts) or a negative supply voltage lower than ground. In FIG. 8, the first and second parasitic capacitances CPW-DNW, CDNW-SUB are depicted with a diagonal arrow drawn through them, which indicates the non-linear nature of these capacitances CPW-DNW, CDNW-SUB.

As depicted in FIG. 8, in the circuit 64 of FIG. 7 it is the first parasitic capacitance CPW-DNW that dominantly appears at the node receiving the input voltage VIN. This can be understood, from one viewpoint, because, as an approximation, the upper supply voltage VDD may be regarded as relatively constant, and so in a small signal analysis becomes equivalent to ground, and thus in a small-signal situation the second parasitic capacitance CDNW-SUB can effectively disappear from the circuit configuration 68.

Any non-linear parasitic capacitance appearing at the node receiving the input voltage can be undesirable because, not only will the capacitive nature of such an element slow down the response of the circuit, but also the non-linear nature of such an element will introduce distortion to signals processed by the circuit. Thus, generally speaking, it is relatively less desirable to have a larger non-linear capacitance appearing at the node receiving the input voltage VIN than a smaller non-linear capacitance. Therefore, one potential disadvantage of the parasitic-capacitance configuration 68 of FIG. 8 is that, of the first and second parasitic capacitances CPW-DNW, CDNW-SUB, the first parasitic capacitance CPW-DNW is potentially larger than the second parasitic capacitance CDNW-SUB, and therefore it can be relatively less desirable for the first parasitic capacitance CPW-DNW to appear at the node receiving the input voltage VIN in comparison to or instead of the second parasitic capacitance CDNW-SUB.

To understand why the first parasitic capacitance CPW-DNW can potentially be larger than the second parasitic capacitance CDNW-SUB, consider the nature of capacitances inherently formed by PN junctions. FIG. 9 depicts an embodiment of a PN junction 72 having two semiconductor regions, including a n-region N having a valence-4 semiconductor, e.g., silicon, doped with electron-producing valence-5 impurities, e.g., phosphorus, connected to a p-region P having the valence-4 semiconductor doped with hole-producing valence-3 impurities, e.g., boron.

The PN junction 72 of FIG. 9 can be a model of the junctions formed by the border between the p-well PW and the deep n-well DNW and the border formed between the deep n-well DNW and the p-substrate SUB. Generally speaking, in operation of any of the circuits discussed herein, the junctions formed at the borders between the p-well PW and the deep n-well DNW and between the deep n-well DNW and the p-substrate SUB are reverse biased. Specifically, reverse biasing the PN junction 72 includes applying a more negative voltage to the p-region P than is applied to the n-region N. In FIG. 9, the n-region N receives a first voltage V1 and the p-region P receives a second voltage V2. Therefore, to reverse bias the depicted PN junction 72, the voltage across the junction, V1-V2, must have positive polarity.

An analysis of the PN junction 72 in FIG. 9 yields a junction capacitance per unit area $C_j$ that can be described as follows:

$$C_j = \frac{C_{j0}}{\sqrt{1 + \frac{V_R}{\Phi_0}}};$$

where $V_R$ is the reverse bias voltage (which is equal to V1-V2 in FIG. 8), $C_{j0}$ is a junction capacitance per unit area when the reverse bias voltage VR is equal to zero, and $\Phi_0$ is a built-in potential of the PN junction 72. The zero-reverse-bias junction capacitance per unit area $C_{j0}$ can be described as follows:

$$C_{j0} = \sqrt{\frac{qK_s\varepsilon_0}{2\Phi_0} \frac{N_A N_D}{N_A + N_D}};$$

where q is the charge of an electron (i.e., the elemental charge), $K_S$ is the relative permitivity of silicon, $\varepsilon_0$ is the permitivity of free space, $N_A$ is the impurity concentration of the junction p-region P, and $N_D$ is the impurity concentration of the junction n-region N. The built-in junction potential $\Phi_0$ can be described as follows:

$$\Phi_0 = \frac{kT}{q} \ln\left(\frac{N_A N_D}{n_i^2}\right);$$

where k is Boltzmann's constant, T is the absolute temperature of the PN junction 72 in kelvins, and $n_i$ is the intrinsic carrier concentration. Note that, in the above equations, the PN junction 72 is assumed to be abrupt.

From the above equations, it is apparent that the junction capacitance $C_j$ is a function of the reverse bias junction voltage $V_R$, the area of the PN junction, and the doping concentrations $N_A$, $N_D$ of the p- and n-regions P, N. With regard to the first and second parasitic capacitances CPW-DNW, CDNW-SUB, of which the junction capacitance $C_j$ can serve as a model, while the area of the second parasitic capacitance CDNW-SUB can typically be larger than that of the first capacitances CPW-DNW, the above equations indicate that the junction capacitance $C_j$ can be dominated by the lower of the two doping concentrations $N_A$, $N_D$ of the p- and n-regions P, N. That is, if the lower of these two doping concentrations $N_A$, $N_D$ tends to at least partially offset the higher of the two concentrations $N_A$, $N_D$ in determining the value of the junction capacitance $C_j$.

To understand how this impacts the potential relative values of the first and second parasitic capacitances CPW-DNW, CDNW-SUB, consider typical doping concentration profiles that can be used for the p-well PW, deep n-well DNW and p-substrate SUB, as a function of depth from the top surface of the circuit structure 20. At the location of the p-well to deep n-well border PW-DNW, the p-well PW has a typical dopant concentration NAPW and the deep n-well DNW has a typical dopant concentration NDDNW1. At the location of the deep n-well to p-substrate border DNW-SUB, the deep n-well DNW has a typical concentration NDDNW2 and the p-substrate SUB has a typical concentration NASUB. However, for typical doping profiles, NAPW>NDDNW1>NDDNW2>NASUB, and thus the value of the first parasitic capacitance CPW-DNW can be dominated by the typical deep n-well concentration NDDNW1, and the value of the second parasitic capacitance CDNW-SUB can be dominated by the typical substrate concentration NASUB. Moreover, because the typical substrate concentration NASUB is less than the typical deep n-well concentration NDDNW1, the impact of the dopant concentrations on the junction capacitances tends to make the first parasitic capacitance CPW-DNW larger than the second parasitic capacitance CDNW-SUB. Furthermore, this effect typically tends to outweigh the effect of the larger area of the first parasitic capacitance CPW-DNW relative to the second parasitic capacitance CDNW-SUB.

Figure 10:
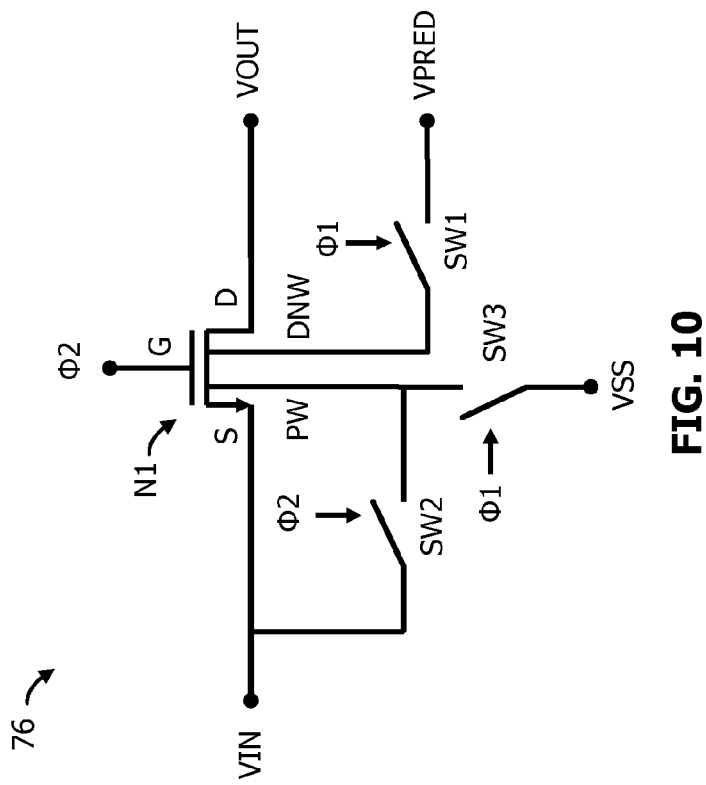
FIG. 10 is a circuit schematic depicting an embodiment of a circuit having the NMOS transistor of FIG. 6 and a plurality of well switches.

FIG. 10 depicts an embodiment of another circuit 76 having the NMOS transistor N1 of FIG. 6. In addition to the NMOS transistor N1, the circuit 76 of FIG. 10 includes a plurality of well switches SW1, SW2, SW3 configured to selectively switch the p-well PW and deep n-well DNW between different circuit nodes. The selective well-switching provided by the well switches SW1, SW2, SW3 can enable a more desirable configuration of the first and second parasitic capacitances CPW-DNW, CDNW-SUB.

A first well switch SW1 is configured to selectively switch the deep n-well DNW between a predetermined voltage VPRED and an electrically floating state in response to the enable phase 52 of the first switching signal φ1. That is, in the enable phase 52 of the first switching signal φ1, the first well switch SW1 electrically connects the deep n-well DNW to the predetermined voltage VPRED. In a non-enable phase 54 of the first switching signal φ1, which includes the remaining portion of the first switching signal φ1 other than the enable phase 52, the deep n-well DNW is disconnected from the predetermined voltage VPRED and put into an electrically floating state. Note that, in the circuit 76 of FIG. 10, the NMOS transistor N1 is switched according to the enable phase 56 of the second switching signal φ2. Thus, because the first and second switching signals φ1, φ2 have non-overlapping enable phases 52, 56, in FIG. 10 the entire time the deep n-well DNW is connected to the predetermined voltage VPRED, the NMOS transistor N1 is disabled (i.e., turned off), and the entire time the NMOS transistor N1 is enabled (i.e., turned on), the deep n-well DNW is electrically floating.

The circuit 76 of FIG. 10 also includes a second well switch SW2 and a third well switch SW3 configured to selectively switch the p-well PW between the source S of the NMOS transistor N1 and a lower supply voltage VSS, respectively. In the enable phase 52 of the first switching signal φ1, the second well switch SW2 electrically connects the p-well PW to the source S of the NMOS transistor N1. In the non-enable phase 54 of the first switching signal φ1, the p-well PW is disconnected from the source S of the NMOS transistor N1. In the enable phase 56 of the second switching signal φ2, the third well switch SW3 electrically connects the p-well PW to the lower supply voltage VSS. In a non-enable phase 58 of the second switching signal φ2, which includes the remaining portion of the second switching signal φ2 other than the enable phase 56, the p-well PW is disconnected from the lower supply voltage VSS. Note that, as discussed above, the lower supply voltage VSS can be ground or a negative supply voltage lower than ground.

Figure 11:
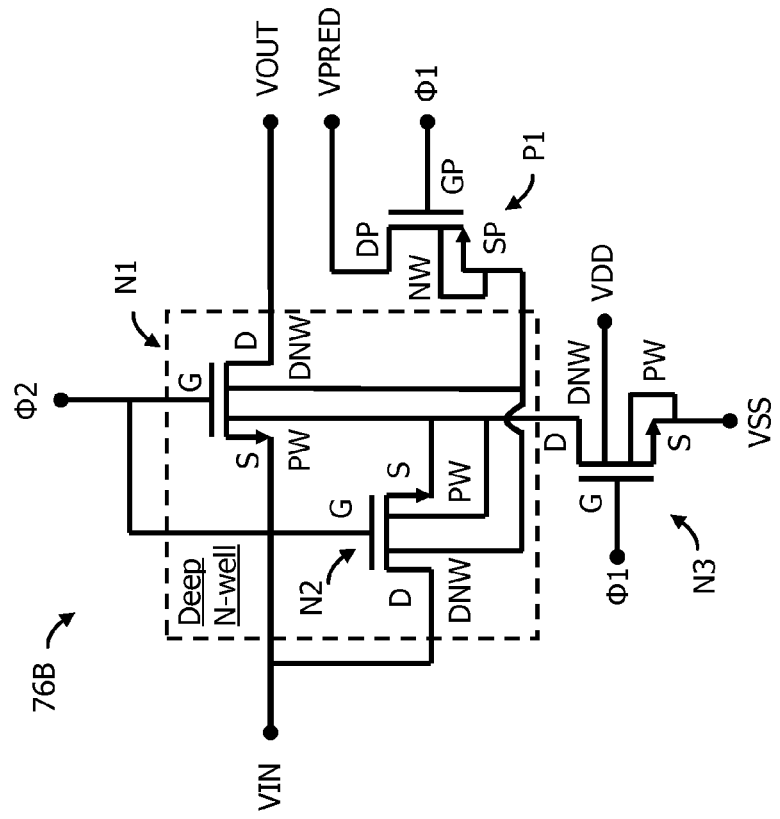
FIG. 11 is a circuit schematic depicting an embodiment of the circuit of FIG. 10 in which the plurality of well switches are implemented by well-switch transistors.

FIG. 11 depicts an embodiment 76B of the circuit 76 of FIG. 10, in which the well switches SW1, SW2, SW3 are implemented with transistors. The first well switch SW1 can be implemented by a first well-switch transistor P1. In FIG. 11, the first well switch SW1 includes a PMOS transistor P1 having a gate GP, source SP and drain DP. The gate GP of the first well-switch transistor P1 is configured to receive the first switching signal φ1, the source SP is connected to the deep n-well DNW, and the drain DP is configured to receive the predetermined voltage VPRED. The connection of the source SP of the first well switch transistor P1 to the deep n-well DNW can be accomplished by forming a conductive connection between the source SP and the deep n-well contact 28. In FIG. 11, because the first well switch SW1 is a PMOS transistor P1, the source SP and drains DP are p-type regions, and therefore are contained inside of an n-type region. The containing n-type region can include either the deep n-well DNW containing the p-well PW containing the NMOS transistor N1, or a separate n-well NW formed on a different portion of the p-substrate SUB than the deep n-well DNW associated with the NMOS transistor N1.

The second and third well switches SW2, SW3 can also be implemented by second and third well-switch transistors N2, N3, respectively. In FIG. 11, the second and third well switches SW2, SW3 include NMOS transistors N2, N3. A second well-switch NMOS transistor N2 includes a gate G connected to the gate G of the NMOS transistor N1, a drain D connected to the source S of the NMOS transistor N1, and a source S connected to the p-well PW containing the NMOS transistor N1. The second well-switch NMOS transistor N2 can be formed in association with a p-well PW and a deep n-well DNW, in the manner of the circuit structure 20 of FIG. 1, and thus can have p-well and deep n-well terminals. In FIG. 11, the P-well PW of the second well-switch NMOS transistor N2 is connected to the p-well PW of the NMOS transistor N1 and the deep n-well DWN of the second well-switch NMOS transistor N2 is connected to the deep n-well DNW of the NMOS transistor N1. Because of the common connection of the p-well PW and deep n-well DNW of the second well-switch NMOS transistor N2 and the NMOS transistor N1, these transistors N2, N1 can both be formed inside of the same p-well PW formed on top of the deep n-well DNW, as depicted in FIG. 11 by the dashed line containing the second well-switch NMOS transistor N2 and the NMOS transistor N1. One advantage to forming both of these transistors N2, N1 in the same p-well PW and deep n-well DNW is the conservation of substrate area.

A third well-switch NMOS transistor N3 includes a gate G configured to receive the second switching signal φ2 and connected to the gate G of the NMOS transistor N1, a drain D connected to the p-well PW containing the NMOS transistor N1, and a source S connected to the lower supply voltage VSS. The third well-switch NMOS transistor N3 can be formed in association with a p-well PW and a deep n-well DNW, in the manner of the circuit structure 20 of FIG. 1, and thus can have p-well and deep n-well terminals. In FIG. 11, the p-well PW of the third well-switch NMOS transistor N3 is connected to the lower supply voltage VSS and the deep n-well DNW of the third well-switch NMOS transistor N3 is connected to the upper supply voltage VDD. Because of the different connections of the p-well PW and deep n-well DNW of the third well-switch NMOS transistor N3 and the NMOS transistor N1, these transistors are not formed inside of the same p-well PW and on top of the same deep n-well DNW. Instead, in FIG. 11, the third well-switch NMOS transistor N3 is contained in a second p-well PW, electrically isolated from the p-well PW containing the NMOS transistor N1 and formed on top of a second deep n-well DNW, which is electrically isolated from the deep n-well DNW under the NMOS transistor N1. Alternatively, the third well-switch NMOS transistor N3 can be formed without utilizing the deep n-well structure 20 of FIG. 1, and can instead optionally be contained directly in the p-substrate SUB.

FIG. 12 depicts an embodiment of a configuration 80 of the first and second parasitic capacitances CPW-DNW, CDNW-SUB resulting from the circuit 76 of FIGS. 10 and 11. The configuration 80 of FIG. 12 shows the selective connection of the parasitic capacitances CPW-DNW, CDNW-SUB to the input voltage VIN, the predetermined voltage VPRED and the lower supply voltage VSS. FIG. 13 depicts the configuration 80A of FIG. 12 during the enable phase 52 of the first switching signal φ1. FIG. 14 depicts the configuration 80B of FIG. 12 during the enable phase 56 of the second switching signal φ2.

Note that in an embodiment in which the NMOS transistor N1 implements a switch such as the first switch S1 of the switched-capacitor circuit 48 of FIG. 2, or a similar signal-path switched-capacitor switch that samples an input voltage to generate an output voltage for a capacitor, the enable phase 56 of the second switching signal φ2 can be regarded as a sample phase, and the enable phase 52 of the first switching signal φ1 can be regarded as a hold phase. During the sample phase, the NMOS transistor N1 is turned on and the input voltage VIN at its source S is passed to the output voltage VOUT at its drain D, and any capacitor having a terminal connected to the drain D will have this terminal charged to the output voltage VOUT. During the hold phase, the NMOS transistor N1 is turned off, and the input voltage VIN at its source S is disconnected from the drain D, and any capacitor having a terminal connected to the drain D will have this terminal disconnected from the input voltage VIN. Typically, during a hold phase, the capacitor attempts to hold constant the voltage to which it was charged during the sample phase.

Note that the benefits provided by selective p-well and deep n-well switching enabled by the circuit 76 of FIGS. 10 and 11 is not confined to switched-capacitor circuits operated according to sample and hold phases. Instead, this particular application is described to illustrate possible benefits of the selective p-well and deep n-well switching enabled by the circuit 76 of FIGS. 10 and 11.

Returning to FIG. 13, during the enable phase 52 of the first switching signal φ1, e.g. the hold phase in a switched-capacitor voltage-sampling application, both the first and second parasitic capacitances CPW-DNW, CDNW-SUB are charged to the predetermined voltage VPRED. In one embodiment, the predetermined voltage VPRED can be either the upper supply voltage VDD or a boosted voltage VBOOST greater than the upper supply voltage VDD. Then, as depicted in FIG. 14, during the enable phase 56 of the second switching signal φ2, e.g., the sample phase in a switched-capacitor voltage-sampling application, the deep n-well DNW is put into an electrically floating state and the input voltage VIN is applied to the swell PW. In the electrically floating state, the deep n-well DNW is not driven to a particular voltage, but instead adjusts to a voltage that is dictated by other circuit nodes through their indirect influence on the deep n-well DNW. In the configuration 80B of FIG. 14, the deep n-well DNW will be influenced by the input voltage VIN appearing at the p-well PW, and will assume a voltage approximately equal to VPRED+xVIN, where x is a multiplying factor, typically assuming a value in the range of from zero to 1. Thus, if the input voltage VIN has a positive polarity, the voltage of the deep n-well DNW will be boosted by some amount above the predetermined voltage VPRED.

One potential advantage of the parasitic capacitance configurations 80A, 80B of FIGS. 13 and 14, relative to that depicted in FIG. 8, is that in the enable phase 56 of the second switching signal φ2, e.g., when the input voltage VIN is being sampled by the NMOS transistor N1, both of the first and second parasitic capacitances CPW-DNW, CDNW-SUB now appear in series at the circuit node receiving the input voltage VIN. This is advantageous in comparison to FIG. 8, in which primarily only the first parasitic capacitance CPW-DWN appeared at the node receiving the input voltage VIN because for a series combination of two capacitances, the overall capacitance value will be dominated by the smaller of the two capacitances. Thus, because, as discussed above, the second parasitic capacitance CDNW-SUB tends to have a lower value than the first parasitic capacitance CPW-DNW, the series combination of the first and second parasitic capacitances CPW-DNW, CDNW-SUB will tend to have a lower value than the first parasitic capacitance CPW-DNW by itself. Thus, the appearance of the series combination of the first and second parasitic capacitances CPW-DNW, CDNW-SUB at the node receiving the input voltage VIN has the effect of lowering the non-linear capacitance appearing this node, relative to the configuration 68 of FIG. 8, which can be beneficial.

Another potential advantage of the parasitic capacitance configurations 80A, 80B of FIGS. 13 and 14, relative to that depicted in FIG. 8, is that because the voltage of the deep n-well DNW, during the enable phase 56 of the second switching signal φ2, floats to a voltage VPRED+xVIN above the predetermined voltage VPRED, e.g., above the upper supply voltage VDD when the predetermined voltage VPRED is equal to the upper supply voltage VDD, the deep n-well DNW of FIG. 14 potentially has a higher voltage during the enable phase 56 of the second switching signal φ2 than the deep n-well DNW of FIG. 8. This can translate into lower parasitic capacitance values in general for the first and second parasitic capacitances CPW-DNW, CDNW-SUB of FIG. 14, relative to those of FIG. 8, because, as discussed above in regards to the equations describing the junction capacitance $C_j$ of the PN junction 72, an increased reverse bias voltage $V_R$ (in this case increased because of the increased deep n-well voltage) reduces the capacitance value of the non-linear first and second parasitic capacitances CPW-DNW, CDNW-SUB.

As discussed above, in one embodiment the predetermined voltage VPRED can be the upper supply voltage VDD. In another embodiment, the predetermined voltage VPRED can be a boosted voltage VBOOST that has a higher magnitude than the upper supply voltage VDD. As discussed above, in the circuit of FIG. 10, having the predetermined voltage VPRED be the boosted voltage VBOOST can potentially enhance the reduction of the parasitic capacitance by increasing the reverse bias voltage $V_R$ appearing across the p-well to deep n-well border PW-DNW and the deep n-well to p-substrate border DNW-SUB.

FIG. 15 depicts an embodiment of a voltage-boosting circuit 84 configured to generate the boosted voltage VBOOST. The depicted voltage-boosting circuit 84 includes an inverter INV, a pair of capacitors C3, C4, and a pair of NMOS transistors N4, N5; and receives a clock signal VCLK and the upper supply voltage VDD. FIG. 16 depicts one embodiment of the inverter INV, having an NMOS and a PMOS transistor N6, P2.

FIG. 17 depicts an embodiment of another circuit 88 having the NMOS transistor N1 of FIG. 6. The circuit 88 of FIG. 17 is similar to that of FIG. 10, with a difference being that the circuit 88 additionally includes a fourth well switch SW4. Together, the third and fourth well switches SW3, SW4 are configured to selectively switch the deep n-well DNW between the upper supply voltage VDD and the source S of the NMOS transistor N1. In the enable phase 52 of the first switching signal φ1, the first well switch SW1 electrically connects the deep n-well DNW to the upper supply voltage VDD. In the non-enable phase 54 of the first switching signal φ1, the deep n-well DNW is disconnected from the upper supply voltage VDD. In the enable phase 56 of the second switching signal φ2, the fourth well switch SW4 electrically connects the deep n-well DNW to the source S of the NMOS transistor N1. In the non-enable phase 58 of the second switching signal φ2, the deep n-well DNW is disconnected from the source S of the NMOS transistor N1.

FIG. 18 depicts an embodiment of a configuration 92A of the first and second parasitic capacitances CPW-DNW, CDNW-SUB resulting from the circuit 88 of FIG. 17 during the enable phase 52 of the first switching signal φ1. In FIG. 18, both the first and second parasitic capacitances CPW-DNW, CDNW-SUB are connected between the upper supply voltage VDD and the lower supply voltage VSS. FIG. 19 depicts an embodiment of a configuration 92B of the first and second parasitic capacitances CPW-DNW, CDNW-SUB resulting from the circuit 88 of FIG. 17 during the enable phase 56 of the second switching signal φ2. In FIG. 19, the first parasitic capacitance CPW-DNW is effectively shorted out because both the p-well PW and the deep n-well DNW are connected the same node, i.e., the source S of the NMOS transistor N1, during the enable phase 56 of the second switching signal φ2. Thus, during the enable phase 56 of the second switching signal φ2, of the first and second parasitic capacitances CPW-DNW, CDNW-SUB, the parasitic capacitance appearing at the node receiving the input voltage VIN includes the second parasitic capacitance CDNW-SUB and not the first parasitic capacitance CPW-DNW.

One potential advantage of the circuit 88 of FIG. 17, relative to the circuit 64 of FIG. 7, is that the circuit 88 of FIG. 17 can potentially result in a reduced non-linear parasitic capacitance appearing at the node receiving the input voltage VIN than in FIG. 7. In the parasitic capacitance configuration 92B of FIG. 19, it is the second parasitic capacitance CDNW-SUB that appears at the node receiving the input voltage VIN, versus, in the parasitic capacitance configuration 68 of FIG. 8, resulting from the circuit 64 of FIG. 7, it is effectively the first parasitic capacitance CPW-DNW that appears at the node receiving the input voltage VIN. As discussed above, the second parasitic capacitance CDNW-SUB can typically be less than the first parasitic capacitance CPW-DNW, and thus the parasitic capacitance configuration 92B of FIG. 19 typically presents a reduced non-linear parasitic capacitance to the node receiving then input voltage VIN relative to the configuration 68 of FIG. 8.

The circuit 88 of FIG. 17 can be implemented in an embodiment in which the well switches SW1, SW2, SW3, SW4 are implemented with well-switch transistors. For example, the circuit 88 of FIG. 17 can be implemented by the embodiment depicted in FIG. 11, with the addition of a fourth well-switch transistor to Implement the fourth well switch SW4. The fourth well-switch transistor can be either an fourth well-switch NMOS transistor or a fourth well-switch PMOS transistor.

Figure 20:
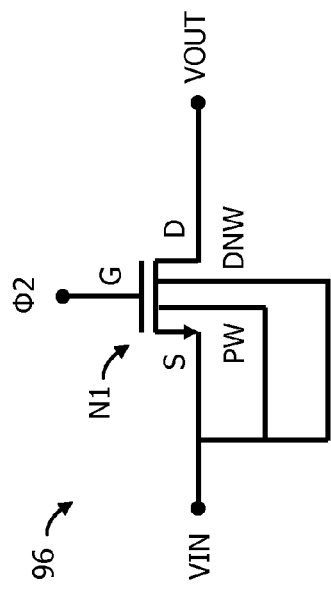
FIG. 20 is a circuit schematic depicting an embodiment of another circuit having the NMOS transistor of FIG. 6.

FIG. 20 depicts an embodiment of another circuit 96 having the NMOS transistor N1 of FIG. 6. The circuit 96 of FIG. 20 can potentially realize some of the beneficial aspects of the circuit 88 of FIG. 17. In FIG. 20, the p-well PW and the deep n-well DNW are connected to the source S of the NMOS transistor N1 at all times. This circuit 96 results in the parasitic capacitance configuration 92B of FIG. 19, i.e., the same parasitic capacitance configuration 92B resulting from the circuit 88 of FIG. 17 during the enable phase 56 of the second switching signal $\phi 2$, at all times for the circuit 96 of FIG. 20. Thus, one potential advantage of the circuit 96 of FIG. 20, similar to that of FIG. 17, is a reduction in the non-linear parasitic capacitance appearing at the node receiving the input voltage VIN because it is the second parasitic capacitance CDNW-SUB that appears at the node receiving the input voltage VIN instead of the first parasitic capacitance CPW-DNW, and the second parasitic capacitance CDNW-SUB can typically be less than the first parasitic capacitance CPW-DNW.

Figure 22:
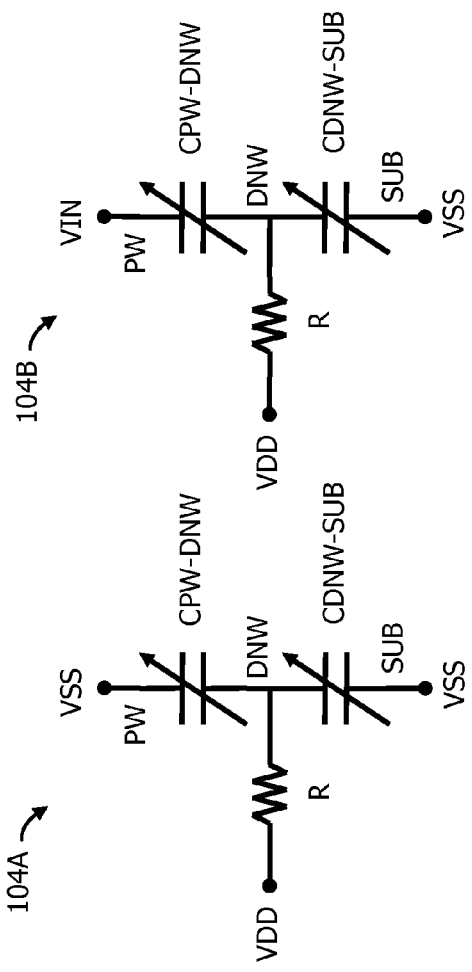
FIG. 22 is a circuit schematic depicting an embodiment of a configuration of parasitic capacitances of the circuit of FIG. 21 during the enable phase of the first switching signal.
Figure 21:
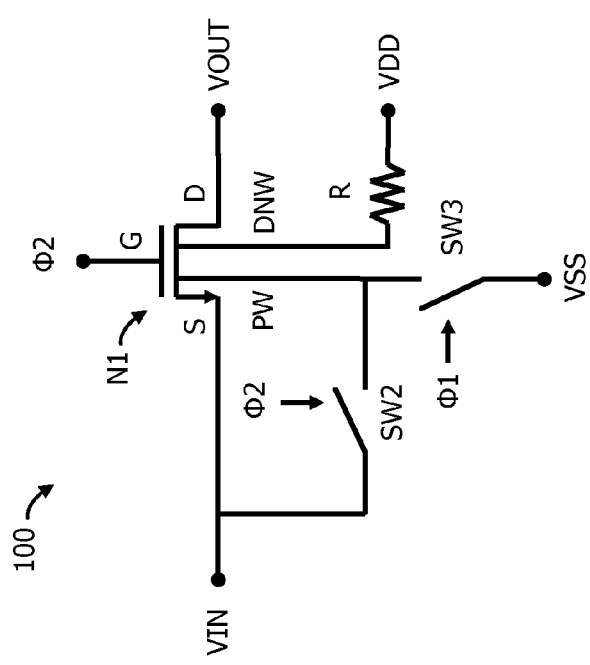
FIG. 21 is a circuit schematic depicting an embodiment of another circuit having the NMOS transistor of FIG. 6 and a plurality of well switches.

FIG. 21 depicts an embodiment of another circuit 100 having the NMOS transistor N1 of FIG. 6. The circuit 100 of FIG. 21 has the second and third well switches SW2, SW3, configured as discussed above in regard to the circuit 76 of FIG. 10, but instead of the first well switch SW1 being configured to switch the deep n-well DNW between the predetermined voltage VPRED and the electrically floating state, the circuit 100 of FIG. 21 connects the deep n-well DNW to the upper supply voltage VDD by a resistor R. FIG. 22 depicts an embodiment of a configuration 104A of the first and second parasitic capacitances CPW-DNW, CDNW-SUB resulting from the circuit 100 of FIG. 21 during the enable phase 56 of the first switching signal $\phi 1$. In FIG. 22, both the first and second parasitic capacitances CPW-DNW, CDNW-SUB are connected in series with the resistor R between the upper supply voltage VDD and the lower supply voltage VSS.

Figure 23:
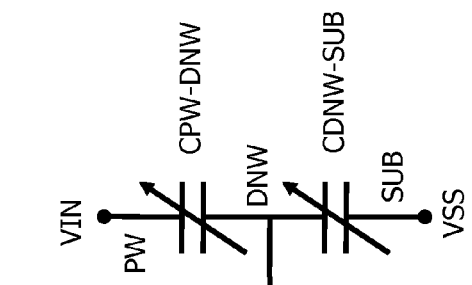
FIG. 23 is a circuit schematic depicting an embodiment of a configuration of parasitic capacitances of the circuit of FIG. 21 during the enable phase of the second switching signal.

FIG. 23 depicts an embodiment of a configuration 104B of the first and second parasitic capacitances CPW-DNW, CDNW-SUB resulting from the circuit 100 of FIG. 21 during the enable phase 56 of the second switching signal $\phi 2$. In FIG. 21, a filter-like configuration of resistances and capacitances, including the resistor R and first and second parasitic capacitances CPW-DNW, CDNW-SUB, appears at the node receiving the input voltage VIN. One potential advantage of the circuit 100 of FIG. 21, relative to the circuit 64 of FIG. 7, is that the parasitic capacitance configuration 104B of FIG. 23 can potentially result in a reduced non-linear parasitic capacitance appearing at the node receiving the input voltage VIN in comparison to the parasitic capacitance configuration 68 of FIG. 8. For example, the filter-like configuration of the resistor R and first and second parasitic capacitances CPW-DNW, CDNW-SUB can potentially reduce the effective non-linear parasitic capacitance appearing at the node receiving the input voltage VIN.

Figure 24:
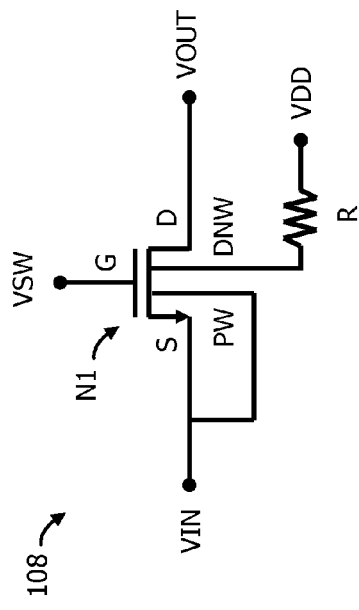
FIG. 24 is a circuit schematic depicting an embodiment of another circuit having the NMOS transistor of FIG. 6.

FIG. 24 depicts an embodiment of another circuit 108 having the NMOS transistor N1 of FIG. 6. In the circuit 108 of FIG. 24, the deep n-well DNW is connected to the upper supply voltage VDD by the resistor R, as in the circuit of FIG. 21. However, unlike the circuit 100 of FIG. 21, in the circuit 108 of FIG. 24, the p-well PW is not switched between the lower supply voltage VSS and the source S of the NMOS transistor N1. Instead, in FIG. 24, the p-well PW is connected to the source S of the NMOS transistor N1 at all times. Thus, the circuit 108 of FIG. 24 has the parasitic capacitance configuration 104B of FIG. 23 at all times. One potential advantage, therefore, of the circuit 108 of FIG. 24, similar to that of the circuit 100 of FIG. 21, is that the parasitic capacitance configuration 104B of FIG. 23, i.e., the filter-like configuration of resistances and capacitances, can potentially result in a reduced non-linear parasitic capacitance appearing at the node receiving the input voltage VIN in comparison to the parasitic capacitance configuration 68 of FIG. 8.

Figure 26:
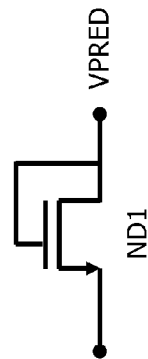
FIG. 26 is a circuit schematic depicting an embodiment of a diode-connected transistor that can be used to implement a diode of the circuit of FIG. 25.
Figure 25:
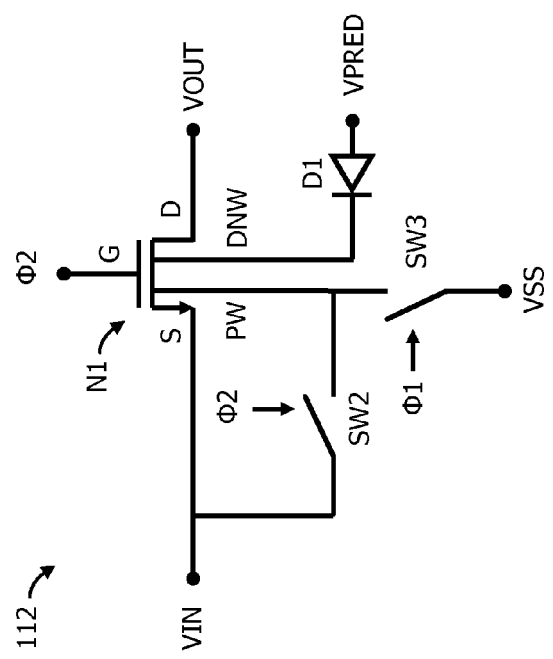
FIG. 25 is a circuit schematic depicting an embodiment of another circuit having the NMOS transistor of FIG. 6 and a plurality of well switches.

FIG. 25 depicts an embodiment of another circuit 112 having the NMOS transistor N1 of FIG. 6. The circuit 112 of FIG. 25 is similar to that of FIG. 10, including the second and third well switches SW2, SW3 configured to selectively switch the p-well PW between the lower supply voltage VSS and the source S of the NMOS transistor N1. However, in FIG. 25, instead of the first well switch SW1 selectively switching the deep n-well DNW between the predetermined voltage VPRED and the electrically floating state, a diode D1 connects the deep n-well DNW to the predetermined voltage VPRED to passively achieve a similar result. That is, when the predetermined voltage VPRED equals VDD or greater, the diode D1 connecting the deep n-well DNW to the predetermined voltage VPRED is turned on (i.e., conducting) during the enable phase 52 of the first switching signal $\phi 1$, and instills a voltage on the deep n-well DNW that is a function of (i.e., approximately equal to) the predetermined voltage VPRED (minus a diode-drop voltage) during the enable phase 52 of the first switching signal $\phi 1$. During the enable phase 56 of the second switching signal $\phi 2$, the diode D1 is turned off (i.e., not conducting), and the deep n-well DNW electrically floats to a voltage higher than the voltage that is a function of (i.e., approximately equal to) the predetermined voltage, similar to the effect produced by the circuit 76 of FIG. 10. One potential advantage of the circuit 112 of FIG. 25 is that the diode D1 requires no switching signal to switch the deep n-well DNW between the voltage that is a function of (and approximately equal to) the predetermined voltage VPRED and the electrically floating state having a voltage higher than the voltage that is a function of (and approximately equal to) the predetermined voltage VPRED. The diode D1 can be implemented by a diode-connected transistor. FIG. 26 depicts one embodiment of a diode-connected NMOS transistor ND1 that can be used to implement the diode D1.

Figure 27:
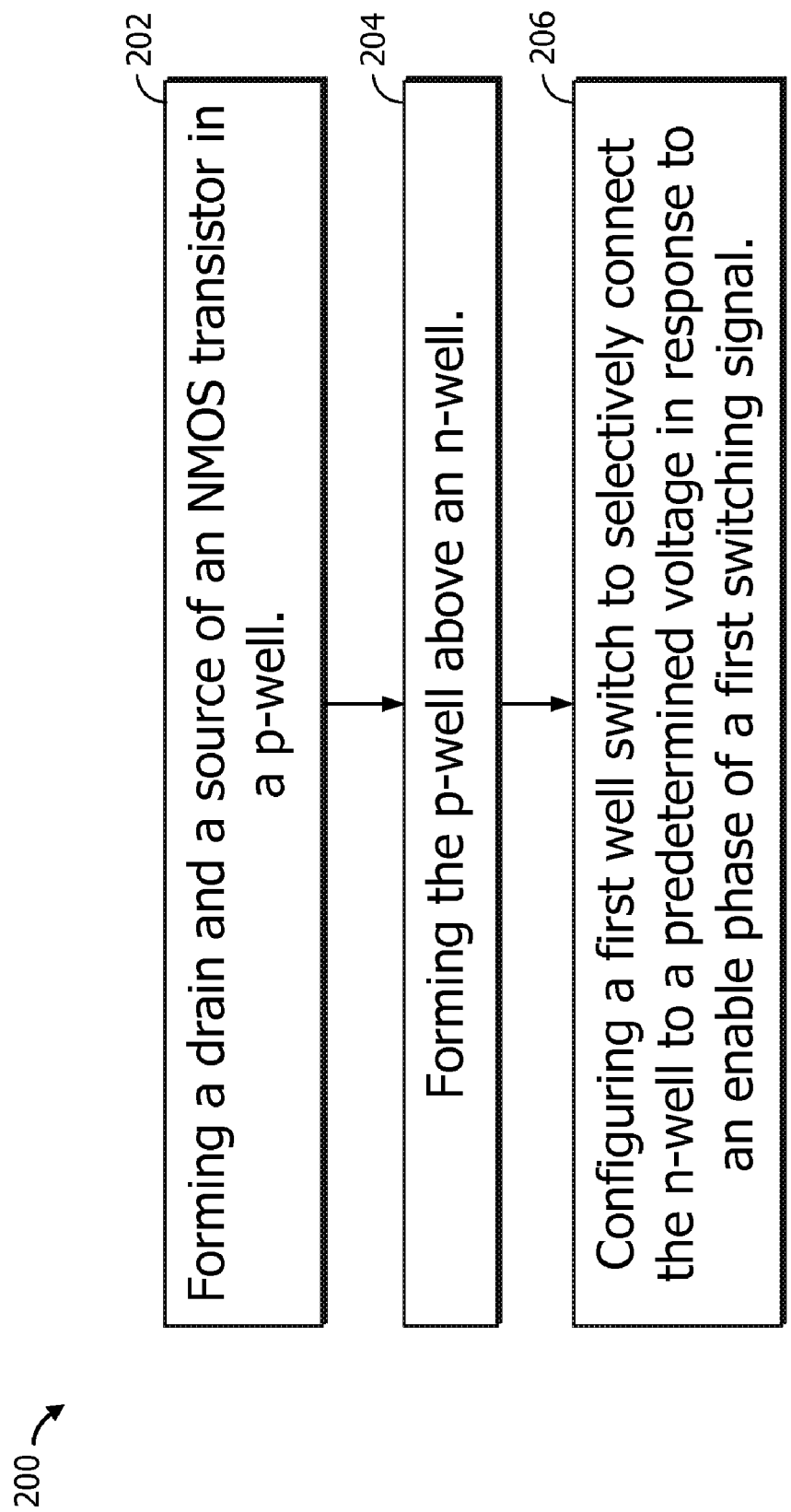
FIG. 27 is a flowchart depicting an embodiment of a method.

FIG. 27 depicts one embodiment of a method 200. In step 202 the method includes forming the drain D and the source S of the NMOS transistor N1 in the p-well PW. In step 204, the method 200 includes forming the p-well PW above the n-well DNW. In step 206, the method 200 includes configuring the first well switch SW1 to selectively connect the n-well DNW to the predetermined voltage VPRED in response to the enable phase 52 of the first switching signal $\phi 1$.

Further embodiments are possible, which are the result of variously combining elements or embodiments described herein.

What is claimed is:
1. A circuit comprising:
an NMOS transistor having a drain and a source;
a p-well containing the drain and the source;
an n-well under the p-well;

a first well switch configured to selectively connect the n-well to a predetermined voltage in response to an enable phase of a first switching signal; and a second well switch configured to selectively connect the p-well to a lower supply voltage received by the circuit in response to the enable phase of the first switching signal.

2. The circuit of claim 1, wherein:

the first well switch electrically floats the n-well during a non-enable phase of the first switching signal.

3. The circuit of claim 2, further comprising a first parasitic capacitance formed at a first border region between the p-well and the n-well, and a second parasitic capacitance formed at a border region between the n-well and a p-substrate under the n-well, and wherein the circuit is configured so that during the non-enable phase of the first switching signal the n-well floats to a voltage having a magnitude above the predetermined voltage by a voltage amount equal to a portion of a voltage received at the source of the NMOS transistor.

4. The circuit of claim 2, wherein the first well switch includes a first well-switch transistor having a terminal connected to a contact contained in the n-well, a gate configured to receive the first switching signal, and another terminal configured to receive the predetermined voltage.

5. The circuit of claim 4, wherein the first well-switch transistor is a PMOS transistor.

6. The circuit of claim 2, wherein the circuit is a switched-capacitor circuit having a capacitor, and the NMOS transistor is configured to sample an input voltage onto the capacitor in response to an enable phase of a second switching signal, the first and second switching signals having non-overlapping enable phases, wherein a gate of the NMOS transistor is configured to receive the second switching signal, the source of the NMOS transistor is configured to receive the input voltage, and the drain of the NMOS transistor is configured to generate an output voltage on the capacitor based on the input voltage.

7. A circuit comprising:

an NMOS transistor having a drain and a source;

a p-well containing the drain and the source;

an n-well under the p-well;

a first well switch configured to selectively connect the n-well to a predetermined voltage in response to an enable phase of a first switching signal; and a second well switch configured to selectively connect the p-well to the source of the NMOS transistor in response to an enable phase of a second switching signal, the first and second switching signals having non-overlapping enable phases.

8. The circuit of claim 7, wherein the second well switch includes a second well-switch transistor having a gate connected to a gate of the NMOS transistor, a drain connected to a source of the NMOS transistor, and a source connected to a contact contained in the p-well; and wherein the drain and source of the second well-switch transistor are contained in the p-well containing the drain and source of the NMOS transistor.

9. The circuit of claim 1, wherein the second well switch includes a well-switch transistor having a gate configured to receive the first switching signal, a drain connected to a contact contained in the p-well, and a source configured to receive the lower supply voltage.

10. The circuit of claim 9, further comprising:

a second p-well containing the drain and source of the well-switch transistor, the second p-well being electrically isolated from the p-well containing the drain and source of the NMOS transistor; and a second n-well under the second p-well, the second n-well being electrically isolated from the n-well under the p-well having the drain and source of the NMOS transistor.

11. The circuit of claim 2, wherein the predetermined voltage is an upper supply voltage received by the circuit.

12. The circuit of claim 2, further comprising a voltage-boosting circuit configured to receive a clock signal and an upper supply voltage received by the circuit and generate a boosted voltage having a magnitude greater than the upper supply voltage, and wherein the circuit is configured to use the boosted voltage as the predetermined voltage.

13. The circuit of claim 12, wherein the voltage-boosting circuit includes a plurality of transistors and a plurality of capacitors.

14. The circuit of claim 2, further comprising a plurality of signal channels, a plurality of the NMOS transistors, a plurality of the p-wells containing the drains and sources of the NMOS transistors, a plurality of the n-wells under the p-wells, and a plurality of the first well switches, wherein each of the plurality of signal channels includes one of the plurality of NMOS transistors, one of the plurality of p-wells, one of the plurality of the n-wells, and one of the plurality of first well switches, and wherein for each signal channel, the first well switch of that channel is configured to selectively connect the corresponding n-well of that channel a corresponding predetermined voltage of that channel in response to the enable phase of the first switching signal.

15. A circuit comprising:

an NMOS transistor having a drain and a source;

a p-well containing the drain and the source;

an n-well under the p-well;

a circuit node configured to receive a predetermined voltage;

a first connection element configured to selectively connect the n-well to the circuit node in response to an enable phase of a first switching signal received by the circuit; and a second connection element configured to selectively connect the p-well to a lower supply voltage received by the circuit in response to the enable phase of the first switching signal.

16. A method comprising:

forming a drain and a source of an NMOS transistor in a p-well;

forming the p-well above an n-well;

configuring a first well switch to selectively connect the n-well to a predetermined voltage in response to an enable phase of a first switching signal; and configuring a second well switch to selectively connect the p-well to a lower supply voltage in response to the enable phase of the first switching signal.

17. The method of claim 16, further comprising configuring the first well switch to connect the n-well to the predetermined voltage during the enable phase of the first switching signal and to electrically float the n-well during a non-enable phase of the first switching signal.

* * * * *